United States Patent [19]

Hayashi

[11] Patent Number: 5,616,509
[45] Date of Patent: Apr. 1, 1997

[54] METHOD FOR FABRICATING A SEMICONDUCTOR DEVICE

[75] Inventor: Shigeru Hayashi, Tokyo, Japan

[73] Assignee: NEC Corporation, Japan

[21] Appl. No.: 534,944

[22] Filed: Sep. 28, 1995

[30] Foreign Application Priority Data

Sep. 28, 1994 [JP] Japan .................................. 6-258936

[51] Int. Cl.$^6$ .............................................. H01L 21/265
[52] U.S. Cl. .......................... 438/234; 438/353; 438/370; 438/373; 438/766; 438/207
[58] Field of Search .................................. 437/34, 56, 58, 437/59, 24, 25, 26, 27

[56] References Cited

U.S. PATENT DOCUMENTS 4,523,213  6/1985  Konaka et al. .......................... 437/24
4,683,637  8/1987  Varker et al. ............................. 437/24
4,963,502  10/1990  Teng et al. ................................ 437/56

FOREIGN PATENT DOCUMENTS 58-111345  7/1983  Japan .

Primary Examiner—Tuan H. Nguyen

[57] ABSTRACT

It is the object of the invention to provide a method for fabricating a semiconductor device, such as a bipolar transistor, with improved characteristics when used in a semiconductor integrated circuit, without increasing the steps in fabricating process. In forming the graft base of the bipolar transistor, oxygen ions with higher energy than that of impurities are injected through the same mask. Thereafter, an insulating film is formed under the graft base region, by activating thermal treatment. Moreover, in a semiconductor integrated circuit of BiCMOS type, insulation films are formed under a source and a drain of a P-type transistor.

10 Claims, 13 Drawing Sheets

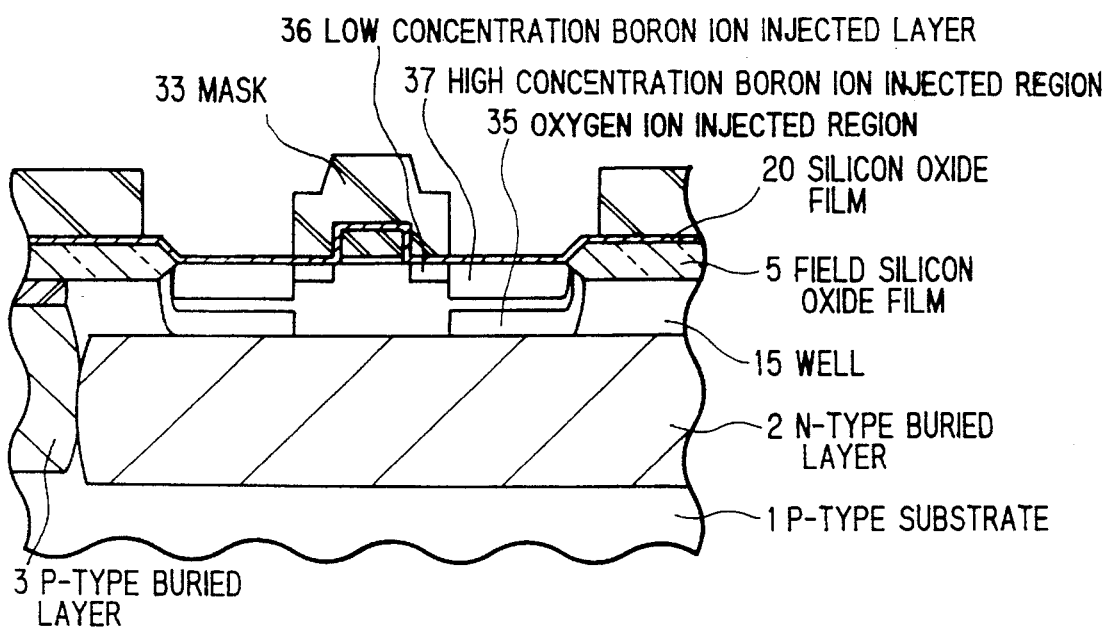
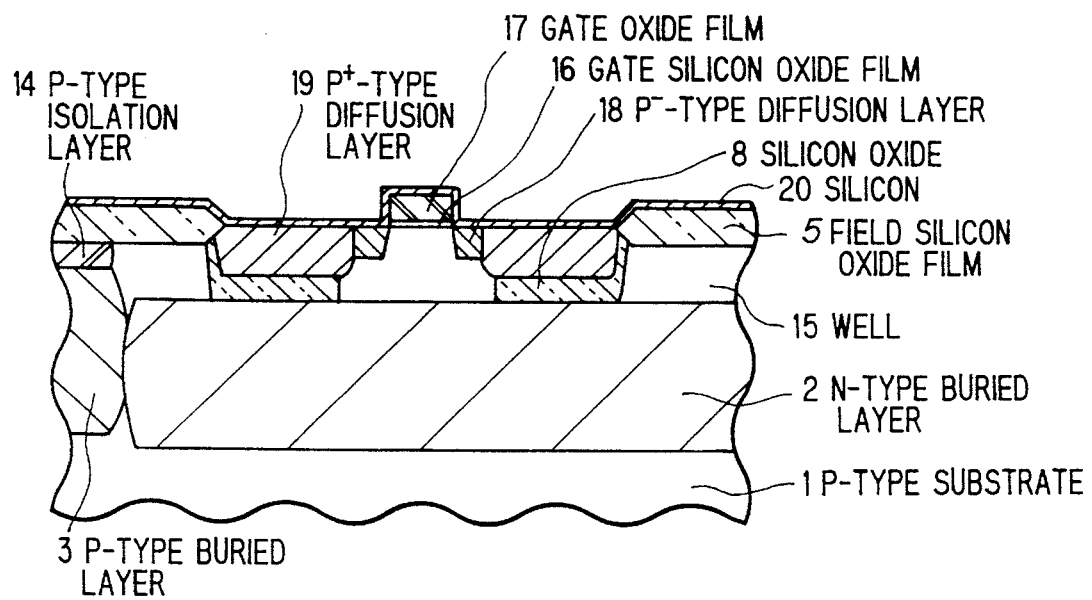

1

METHOD FOR FABRICATING A SEMICONDUCTOR DEVICE

FIELD OF THE INVENTION

This invention relates to a method for fabricating a semiconductor device, more particularly to a method for fabricating bipolar and unipolar transistors having an improved performance without increasing the steps of fabrication.

BACKGROUND OF THE INVENTION

It is very important to supply semiconductor devices, such as a bipolar or field effect transistor with excellent performances at low basic prices. Particularly, basic circuit elements mentioned in the above play the most important roles in a complicated semiconductor circuit, such as a semiconductor integrated circuit, and then the improvements of the methods for fabricating the bipolar and field effect transistors are one of the most important subjects in the field of the semiconductor device industry.

From the view point of the basic prices of the bipolar and field effect transistors, it is undesirable that the number of steps involved in the fabricating process of these transistors increases. From the view point of the performance of the devices, undesirable capacitors between the electrodes should be as small as possible.

In the semiconductor integrated circuit, the bipolar and field effect transistors are used on the same chip in most cases. Then, in fabricating such a semiconductor integrated circuit, it is desirable that some steps in fabricating the bipolar and field effect transistors can be progressed simultaneously, to decrease the steps of fabricating the semiconductor integrated circuit.

SUMMARY OF THE INVENTION

Accordingly, it is an object of the invention to provide a method for fabricating a semiconductor device having an improved performance without increasing the steps of fabrication.

According to the feature of the invention, a method for fabricating a semiconductor device, comprises the steps of:

preparing a semiconductor substrate of a first conductivity type;

forming a buried layer of a second conductivity type opposite to the first conductivity type on the semiconductor substrate, growing an epitaxial layer of the second conductivity type on the processed substrate, selectively forming a silicon oxide film over a surface of the epitaxial layer, forming a first region of the first conductivity type over a portion of an opening of the selectively formed silicon oxide, forming a mask, which is patterned via photolithography and exposes a predetermined portion of the first region, injecting impurity ions of the first conductivity type and oxygen ions successively through the mask, applying a thermal activating treatment to the processed substrate to convert the predetermined portion into a second region, which has higher impurity concentration than that of the first region and contacts with the first region, and to simultaneously form an insulation film therebeneath.

BRIEF DESCRIPTION OF THE DRAWINGS

The invention will be explained in more detail in conjunction with the appended drawings, wherein:

FIGS. 11A–11D show a method for fabricating a P-type MOS transistor according to the invention in order.

DESCRIPTION OF THE PREFERRED EMBODIMENTS

Before explaining a method for fabricating a bipolar transistor and a P-type MOS transistor in the preferred embodiments according to the invention, the aforementioned conventional method for fabricating a bipolar transistor will be explained referring to the appended drawings.

Figure 1:
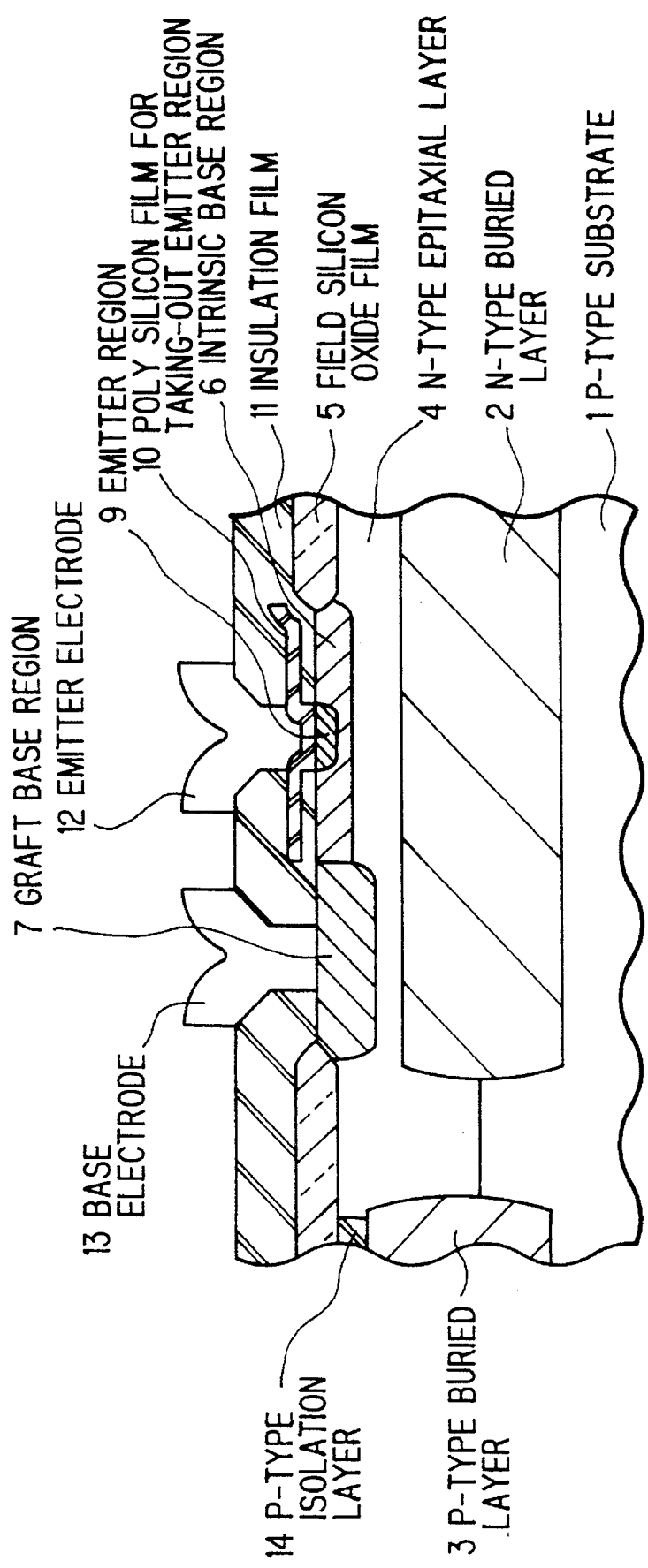
FIG. 1 shows a cross-sectional view of a conventional bipolar transistor.
Figure 3A:
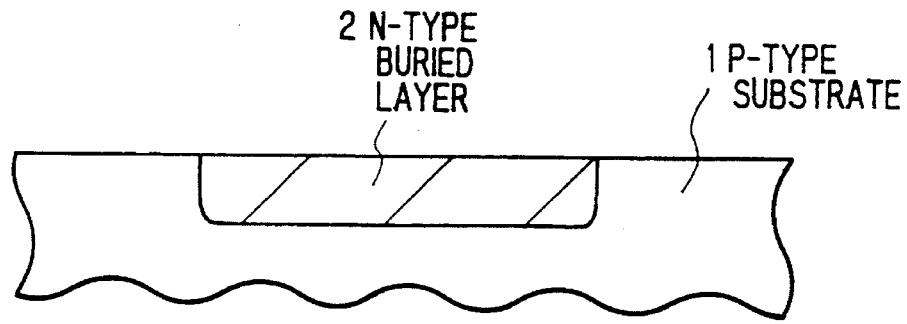
FIGS. 3A–3C show the conventional method for fabricating a bipolar transistor in order.
Figure 3B:
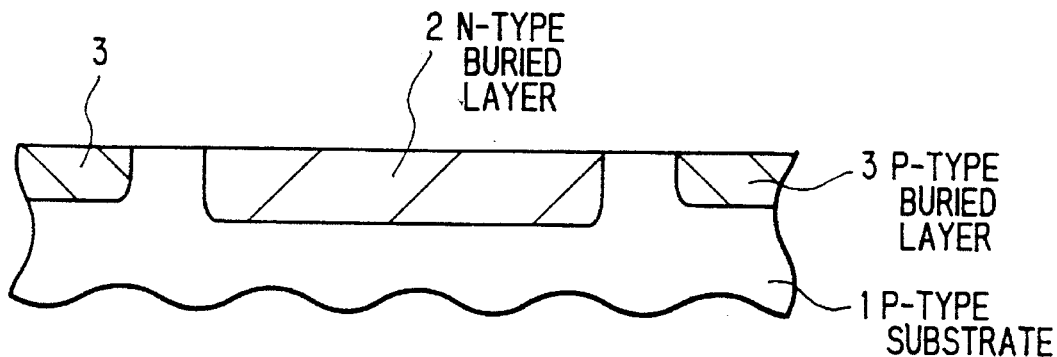

FIG. 1 shows a cross-sectional view of a base-emitter region of a conventional bipolar transistor. An example of a method for fabricating the transistor is as follows. As shown in FIG. 3A, a silicon oxide is grown on a P-type substrate 1, and the silicon oxide is patterned via the steps of photolithography and etching. Using the patterned silicon oxide film as a mask, arsenic ions are injected with a dose amount of $5\times10^{15}$ cm$^{-2}$. Next, after thermal activating treatment is applied to the processed substrate 1 at 1140° C. for 2 hours, arsenic ions are diffused, and the silicon oxide film is removed. In such a way, a N-type buried layer 2 is formed on the surface of the P-type substrate 1.

Next, again using a silicon oxide film as a mask, boron ions are injected with dose amount of $5\times10^{13}$ cm$^{-2}$. Thereafter, thermal activating treatment of 1000° C. is applied to the processed substrate for 60 mins, to grow a P-type buried layer 3.

Figure 3C:
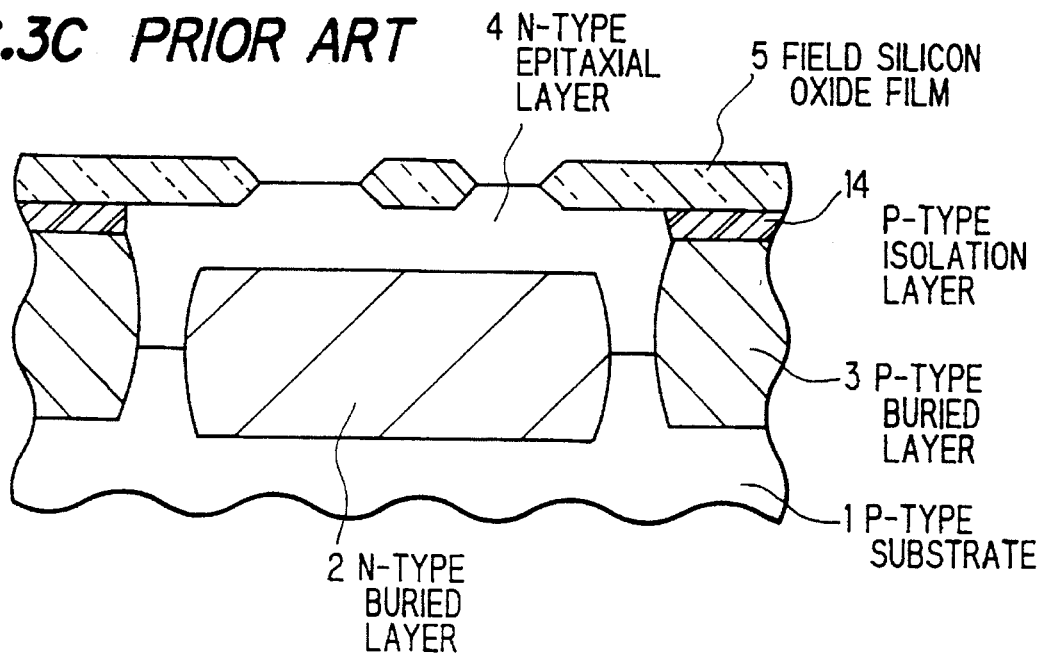

Next, as shown in FIG. 3C, a N-type epitaxial layer 4 is grown thereon, and after a P-type isolation layer 14 is grown on the N-type buried layer 3, a field oxide film 5 is selectively formed on the surface of the processed substrate.

Then, returning to FIG. 1, an intrinsic base region 6, a graft base region 7, an emitter region 9, an emitter taking-out electrode 10, an insulation layer 11, an emitter electrode 12, and a base electrode 13 are formed, thereby a NPN bipolar transistor can be obtained.

In the conventional method to produce the bipolar-transistor, the decrease of the steps involved in the fabricating process by one step of photolithography is now studied, by growing the N- and P-type buried layers in self-alignment.

Figure 2:
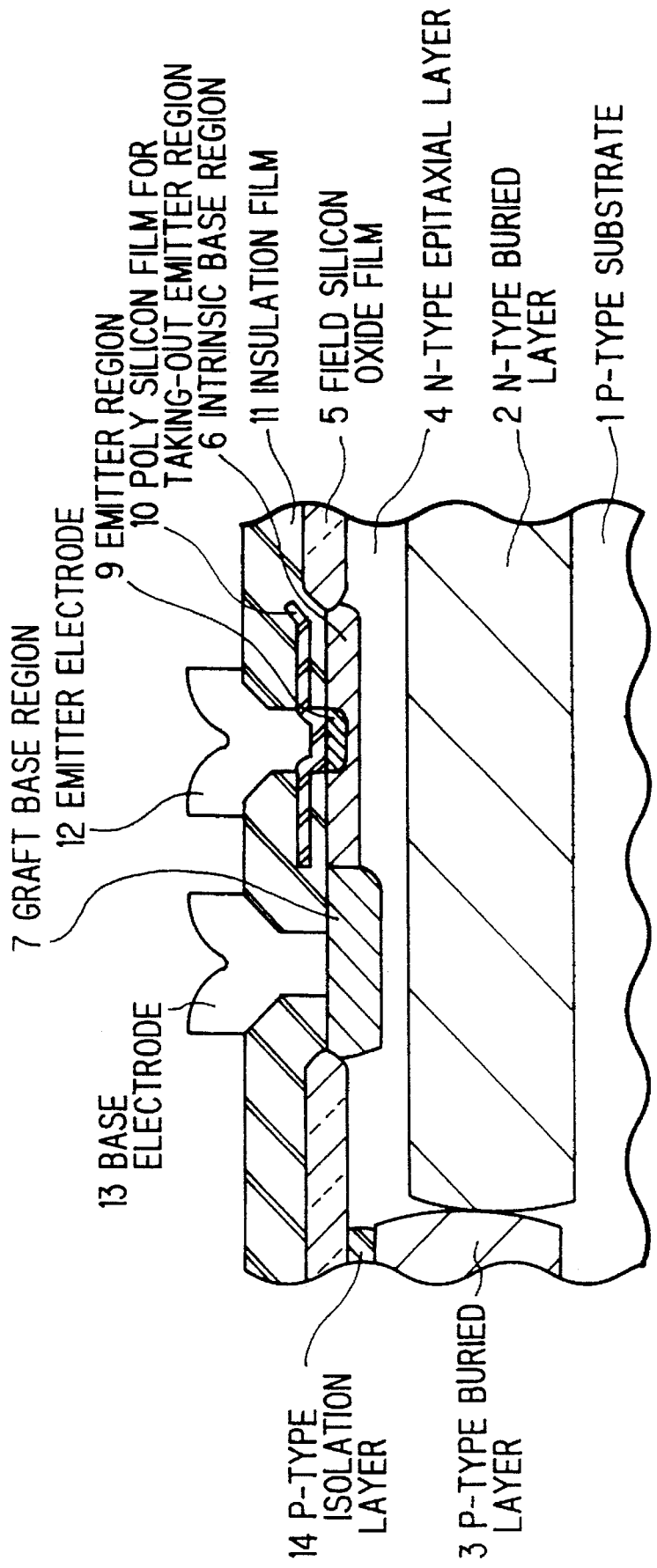
FIG. 2 shows a cross-sectional view of another conventional bipolar transistor.

FIG. 2 shows the cross-sectional view of the base-emitter region of a bipolar transistor produced by the above mentioned method. The method for fabricating the same will be explained hereafter.

Figure 4A:
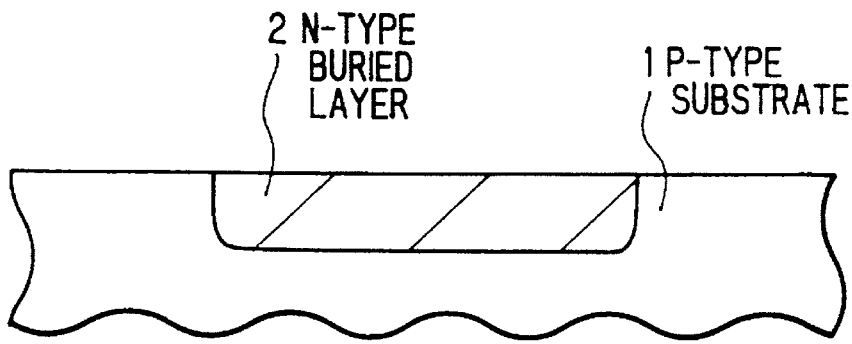
FIGS. 4A–4C show another conventional method for fabricating a bipolar transistor.

Firstly, as shown in FIG. 4A, a N-type buried layer 2 is formed on the surface of a P-type substrate 1. Next, boron ions are injected over the whole surface of the substrate 1, and the P-type buried layer 3 is formed after a thermal activating treatment. In this case, the P-type buried layer 3 is formed over the whole surface of the processed substrate except the N-type buried layer 2, because the amount of boron ions is less than that of the dopant for the N-type buried layer 2, by a factor of about 1/100.

Figure 4B:
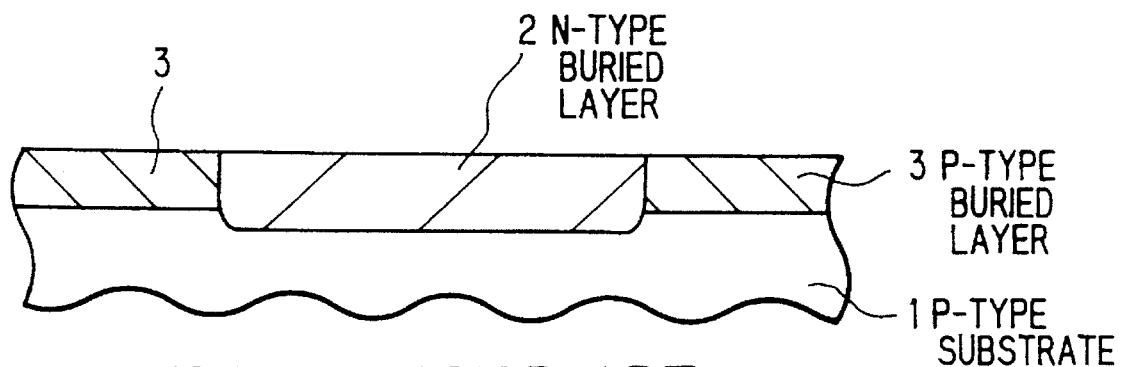
Figure 4C:
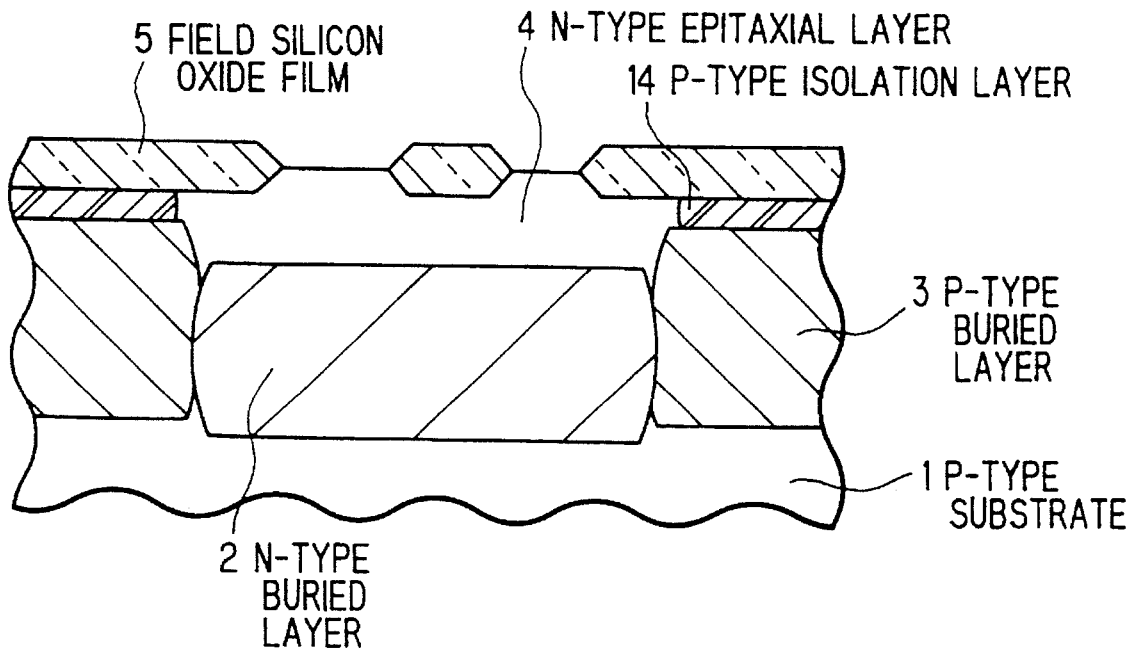

Steps hereafter are similar to those described in the above. As shown in FIG. 4C, a N-type epitaxial layer 4, a P-type isolation layer 14 and a field silicon oxide film 5 are successively formed, and returning to FIG. 2, an intrinsic base region 6, a graft base region 7, an emitter region 9, an emitter taking-out electrode 10, an insulation film 11, an emitter electrode 12 and a base electrode 5 are successively formed, and a NPN type bipolar transistor can be obtained.

Figure 5:
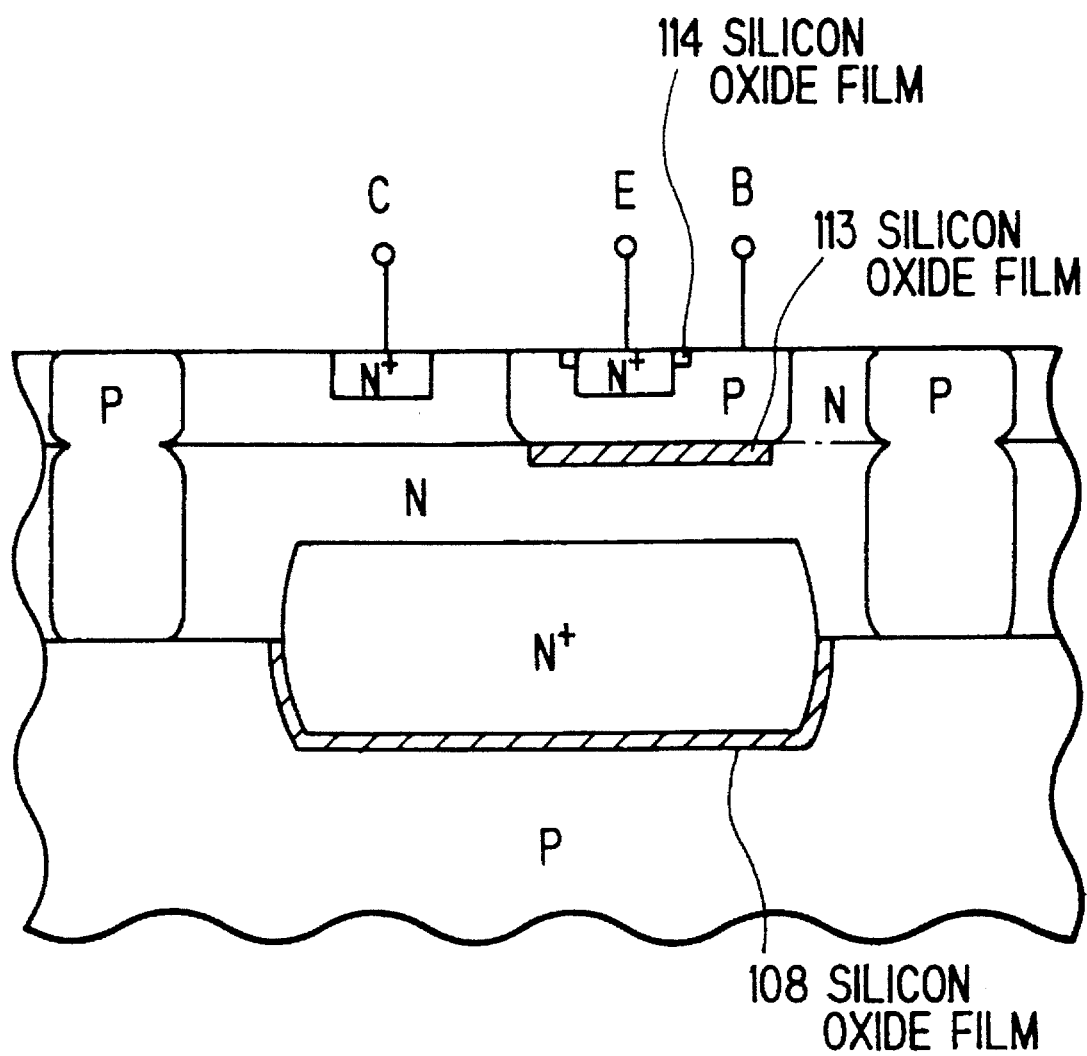
FIG. 5 shows a cross-sectional view of a conventional bipolar transistor.

On the other hand, recently, methods for improving characteristics of various integrated circuits by introducing SIMOX (separate by ion implanted oxygen) technology are investigated. For instance, one of these investigations is shown on Japanese Patent Kokai No. 58-111345, and FIG. 5 shows a cross-sectional view of a bipolar transistor according to the invention. In FIG. 5, 108, 113 and 114 are silicon oxide films, and play roles of decreasing junction capacitances of PN-junction regions.

In the bipolar transistor shown in FIG. 2, the steps of fabricating process can be decreased by one step of photolithography, by forming the N-type buried layer 2 and the P-type buried layer 3 in self-alignment. On the other hand, in order to prevent a breakdown between the P-type buried layer 3 and the graft base region 7 affording sufficient margin, the pattern of the N-type buried layer 2 must be extended in the lateral direction. Consequently, a large junction capacitance arises between the N-type buried layer 2 and the P-type substrate 1, and this effect brings about a disadvantage on the performance of the bipolar transistor.

In an example of a bipolar transistor shown in Japanese Patent Kokai No. 58-111345, the capacitor of the PN-junction is largely decreased by forming silicon oxide film over said PN junction region by means of SIMOX. However, in order to form a silicon oxide film between the N-type epitaxial layer and the P-type base region, one more step of photolithography becomes necessary for patterning the silicon oxide film. Moreover, in fabricating the bipolar transistor shown in FIG. 5, two epitaxial growth is necessary. The cost of one-epitaxial growth is 5 to 10% of the total cost of fabricating the semiconductor device. It can be seen that the bipolar transistor shown in FIG. 5 is economically unprofitable.

Accordingly, it is the feature of the invention to provide a method of a bipolar transistor having excellent performance without increasing the number of steps of fabricating, in view of economical disadvantages of conventional methods.

In the method for fabricating a bipolar transistor according to the invention, a junction capacitor between a base and a collector is decreased by forming an insulation layer beneath a graft base, and moreover, a junction capacitor between a buried layer and a substrate can be decreased in a similar way. Consequently, the speed of operation of the bipolar transistor can be increased.

Moreover, since formations of the insulation film and the graft base are almost simultaneously progressed by means of SIMOX, the total time required for completing the bipolar transistor is hardly increased by introducing a step of forming the insulation films.

In a case, where the invention is applied to a BiCMOS semiconductor integrated circuit, in which both bipolar and P-type MOS transistors are used on the same chip, the steps for forming insulation films can be progressed simultaneously, because the structures of the isolation films beneath the graft base regions of the bipolar transistors and the source and the drain regions of the P-type MOS transistors are similar to each other, and therefore there is no increase of steps of photolithography, and moreover the characteristics are improved.

Figure 6:
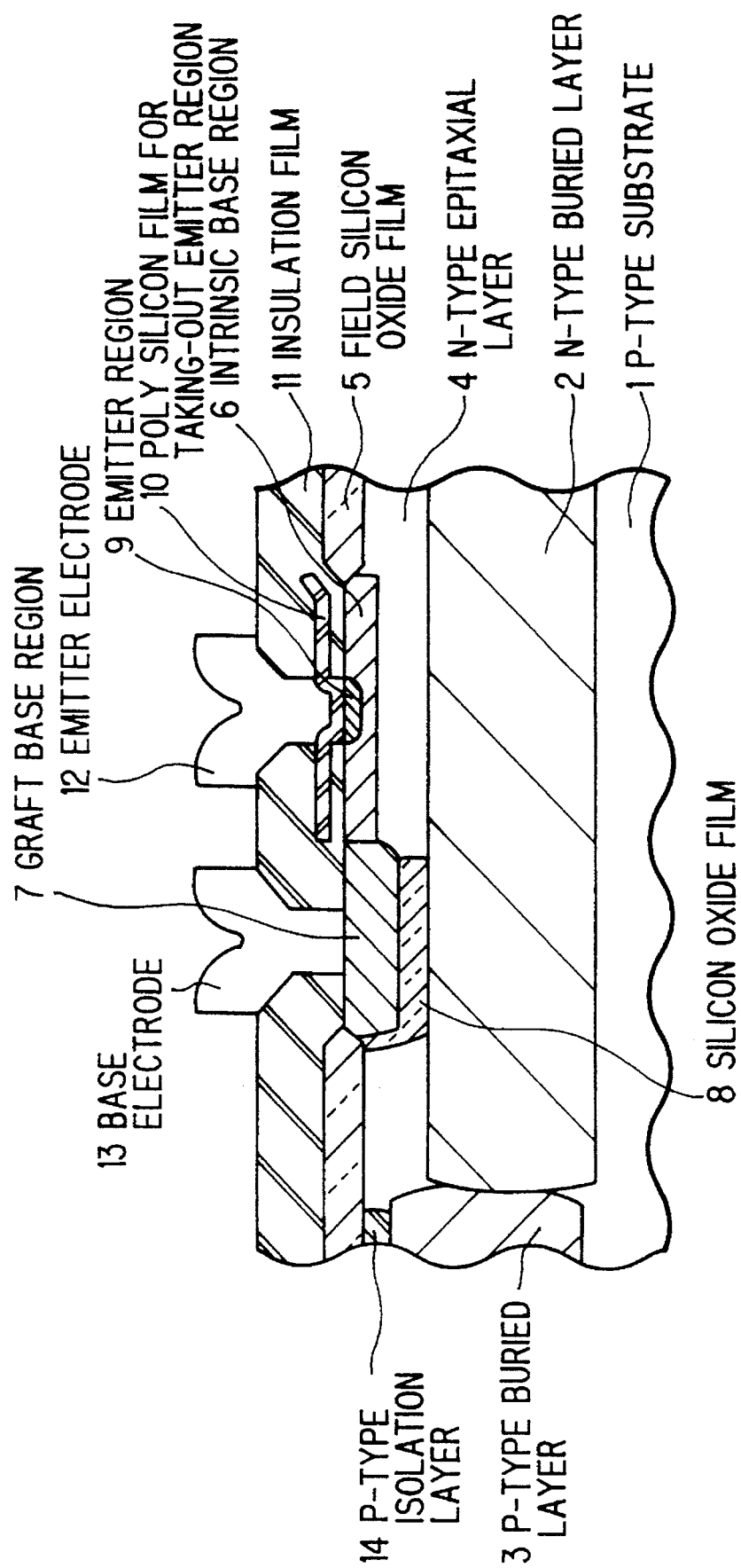
FIG. 6 shows a cross-sectional view of a bipolar transistor fabricated by a method according to the invention as a first preferred embodiment.

FIG. 6 shows a cross-sectional view of the base-emitter region of a bipolar transistor produced by a method for fabricating a bipolar transistor according to the invention as the first preferred embodiment of the invention. In FIG. 6, the silicon oxide film 8 beneath the graft base region 7 is formed by means of SIMOX.

Next, the method for fabricating the bipolar transistor according to the invention will be explained. Firstly, as shown in FIGS. 4A–4C, which has been used for explaining conventional technologies, a N-type buried layer 2 and a P-type buried layer 3 are formed on a P-type substrate 1 in self-alignment. Next, a N-type epitaxial layer 4, a P-type isolation layer 14 and a field silicon oxide film 5 are successively formed.

Figure 9A:
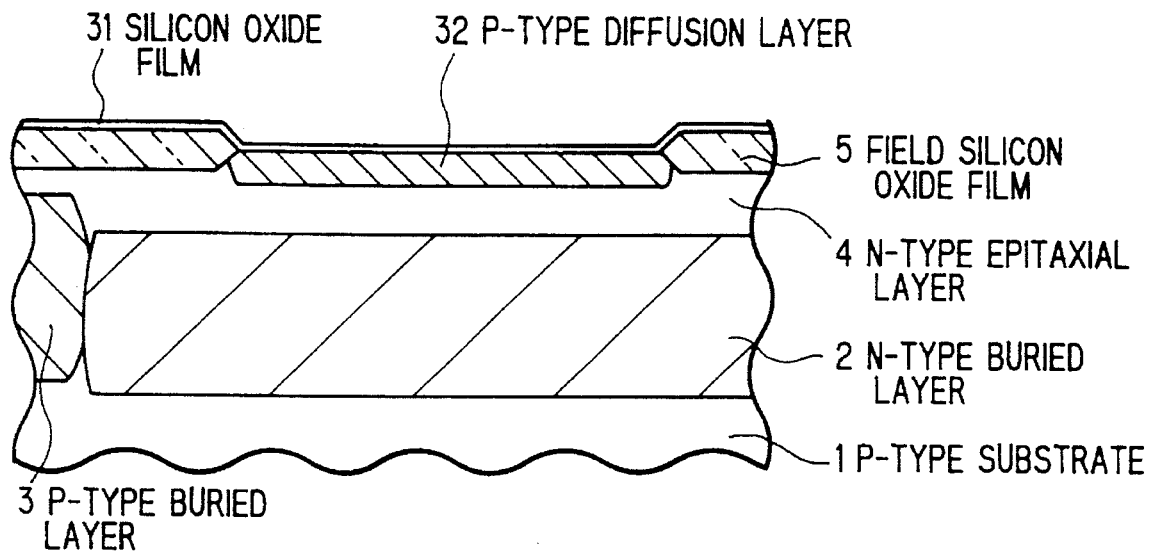
FIGS. 9A–9D show a method for fabricating a bipolar transistor according to the invention in order.

Next, as shown in FIG. 9A, a thin silicon oxide film 31 is formed on the processed substrate, and thereon a resist is patterned via a step of photolithography. Thereafter, using the aforementioned resist as a mask, P-type impurities, boron ions for instance, are injected to the processed substrate with a dose amount of about $2 \times 10^{13}$ cm$^{-2}$. Then, a P-type diffusion layer 32 is formed on the portion of the opening of the field silicon oxide film 5.

Figure 9B:
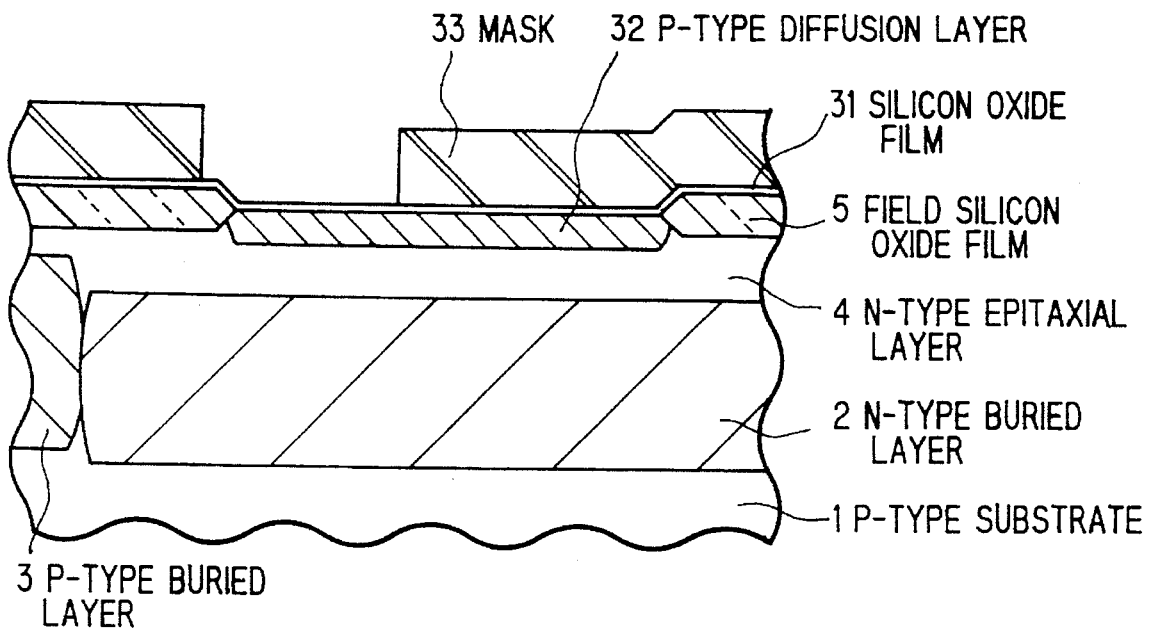

Next, as shown in FIG. 9B, patterning is progressed via a step of photolithography to form a mask 33. As a material of the mask 33, a photo-resist, aluminum or another CVD film can be used.

Figure 9C:
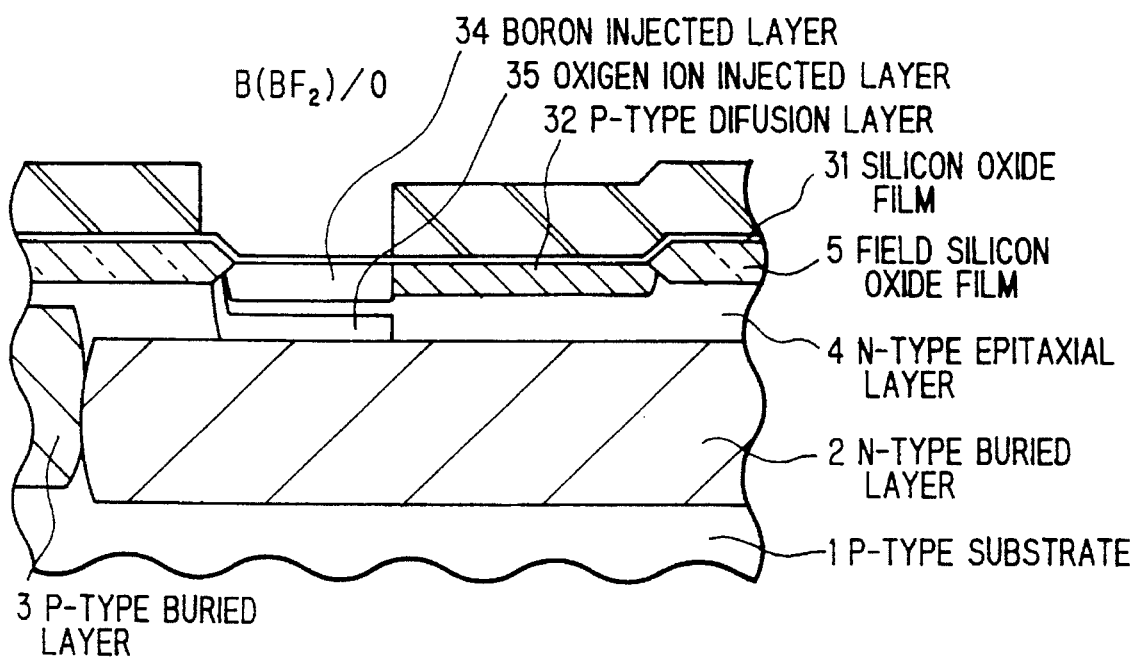

Next, as shown in FIG. 9C, through the mask 33, a P-type impurities, boron ions for instance, are injected by ion implantation with a dose amount of about $5 \times 10^{15}$ cm$^{-2}$ and energy of about 70 keV. Subsequently, through the same mask 33, oxygen ions are injected with dose amount of $1 \times 10^{18}$ cm$^{-2}$ and energy of 150 keV.

In such a way, a boron injected region 34 and oxygen injected region 35 are formed on the processed substrate.

Figure 9D:
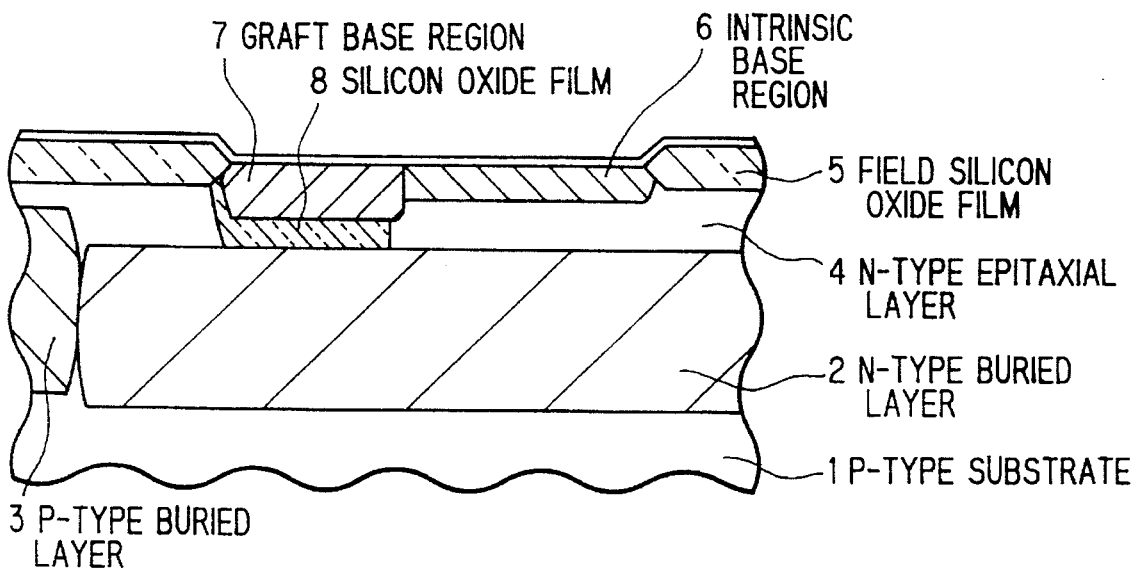

Next, the mask is removed, and a thermal activating treatment is applied to the processed substrate at 900° C. and for 20 mins, and thereby a graft base region 7 and silicon oxide film 8 are formed as shown in FIG. 9D, wherein a P-type diffusion layer 32 in FIG. 9A except a graft base region 7 is an intrinsic base region 6.

Then, returning to FIG. 6, an emitter region 9, a polysilicon for taking-out an emitter electrode 10, a insulation film 11, an emitter electrode 12, and a base electrode 13 are successively formed, and a NPN bipolar transistor can be obtained.

In the bipolar transistor shown in FIG. 6 thus fabricated, since the silicon oxide film 8 separates the graft base region 7 from the N-type buried layer 2, a junction capacitor between the base and the collector is remarkably decreased, and subsequently the cut off frequency of the bipolar transistor $f_T$ is largely increased. Although the collector is not explicitly shown in FIG. 6, the N-type epitaxial layer 4 corresponds to the collector electrode.

Figure 7:
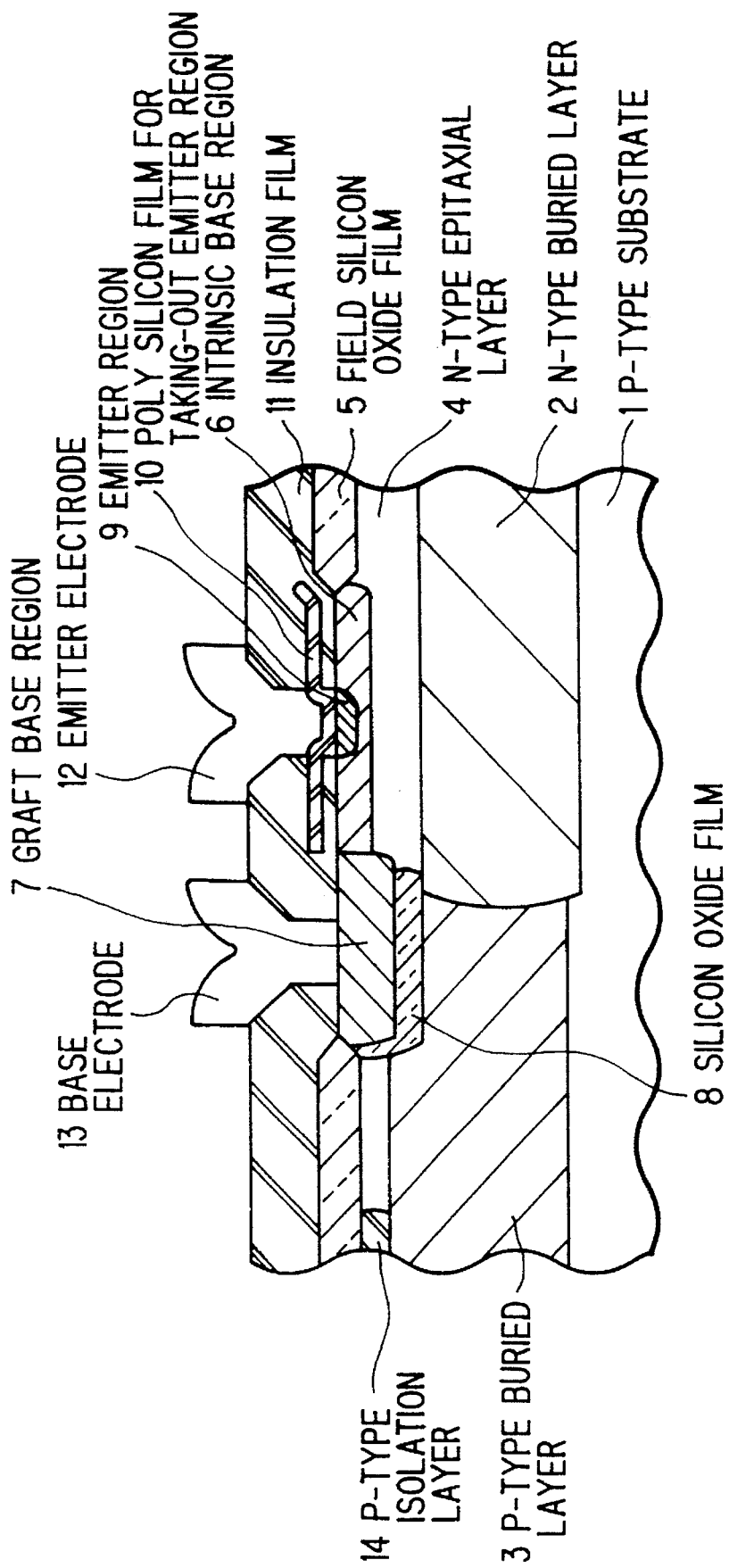
FIG. 7 shows a cross-sectional view of a bipolar transistor fabricated by a method according to the invention as a second preferred embodiment.

FIG. 7 shows a cross-sectional view of a bipolar transistor fabricated by another method, which is the second preferred embodiment of the invention. In the bipolar transistor shown in FIG. 6, the silicon oxide film 8 also plays a role of separating the P-type buried layer 3 from the graft base 7.

Accordingly, as shown in FIG. 7, the pattern of the N-type buried layer 2 can be so reduced that the boundary of the N- and P-type buried layers comes just under the silicon oxide film 8 as shown in FIG. 7. Then, the junction capacitor between the P-type substrate 1 and the N-type buried layer 2 can be decreased in accordance with the reduction of the area of the N-type buried layer 2, and thereby the speed of the operation of the bipolar transistor is largely increased. There is no difference between the bipolar transistors shown in FIG. 6–7, except the position of the boundary of the N- and P-type buried layers.

Figure 8:
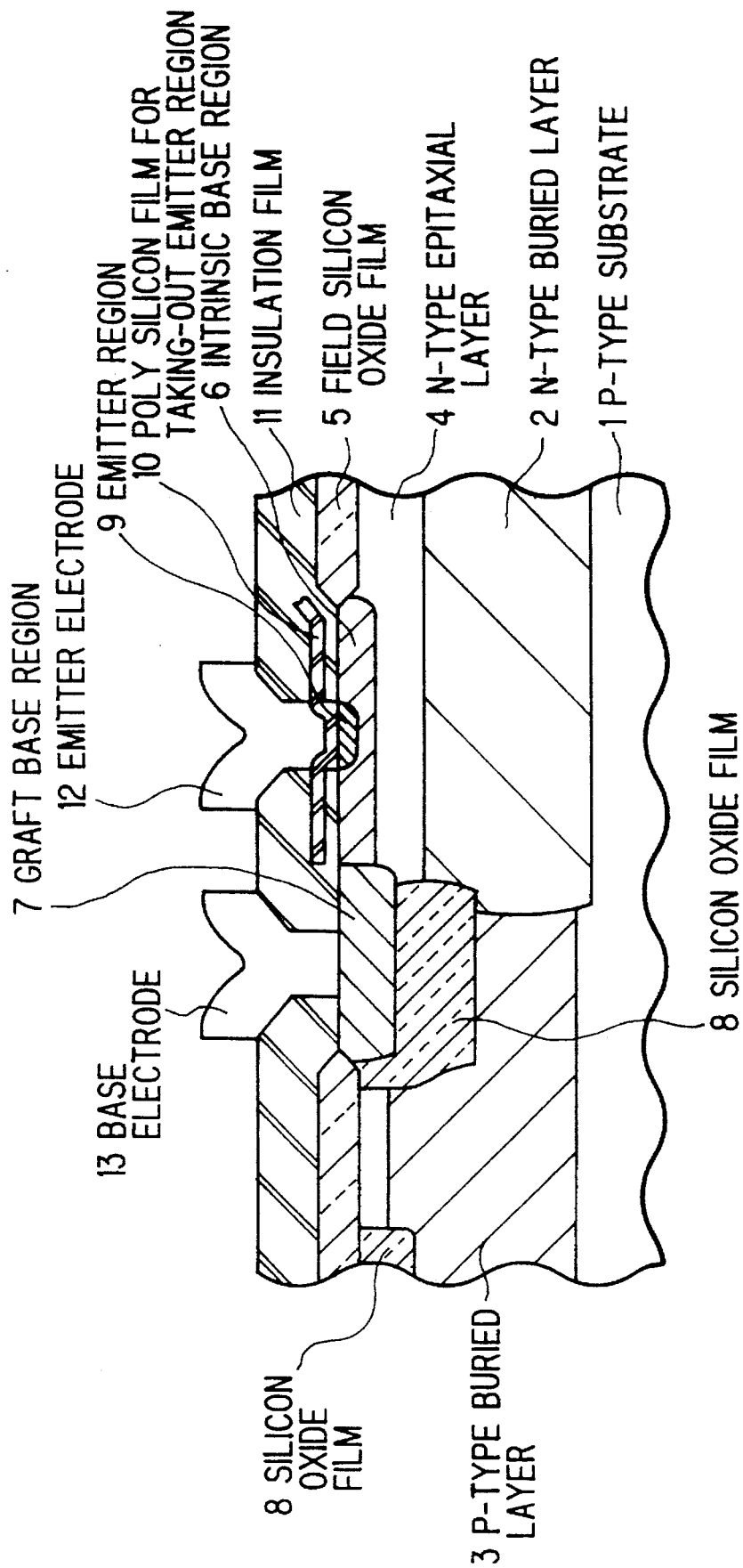
FIG. 8 shows a cross-sectional view of a bipolar transistor fabricated by a method according to the invention as a third preferred embodiment.

FIG. 8 shows a cross-sectional view of bipolar transistor fabricated by another method, which is the third preferred embodiment of the invention. The structure shown in FIG. 8 can be obtained by increasing the energy and the dose amount of injected oxygen ions in the process of fabricating the structure shown in FIG. 6, and the thickness and the area of the silicon oxide film are increased as compared with those shown in FIG. 6. When the circumference of the opening pattern of the mask 33 is put on a portion of the field silicon oxide film 5, the oxygen ions pass through said portion of film 5, and then the field silicon oxide film is formed under the field silicon oxide film 5.

Consequently, the P-type isolation layer 14 can be replaced by a silicon oxide 8, and thereby one step of photolithography for growing the P-type isolation film can be cut down.

Moreover, since the silicon oxide film 8 deeply intrudes into the boundary region between the N-type buried layer 2 and the P-type buried layer 3, the area of the boundary region is decreased, and a junction capacitor therebetween is decreased. As a results, the speed of the operations of the bipolar transistor can be still more increased.

The fourth preferred embodiment of the invention is shown in FIG. 10 and FIGS. 11A–11D.

Figure 10:
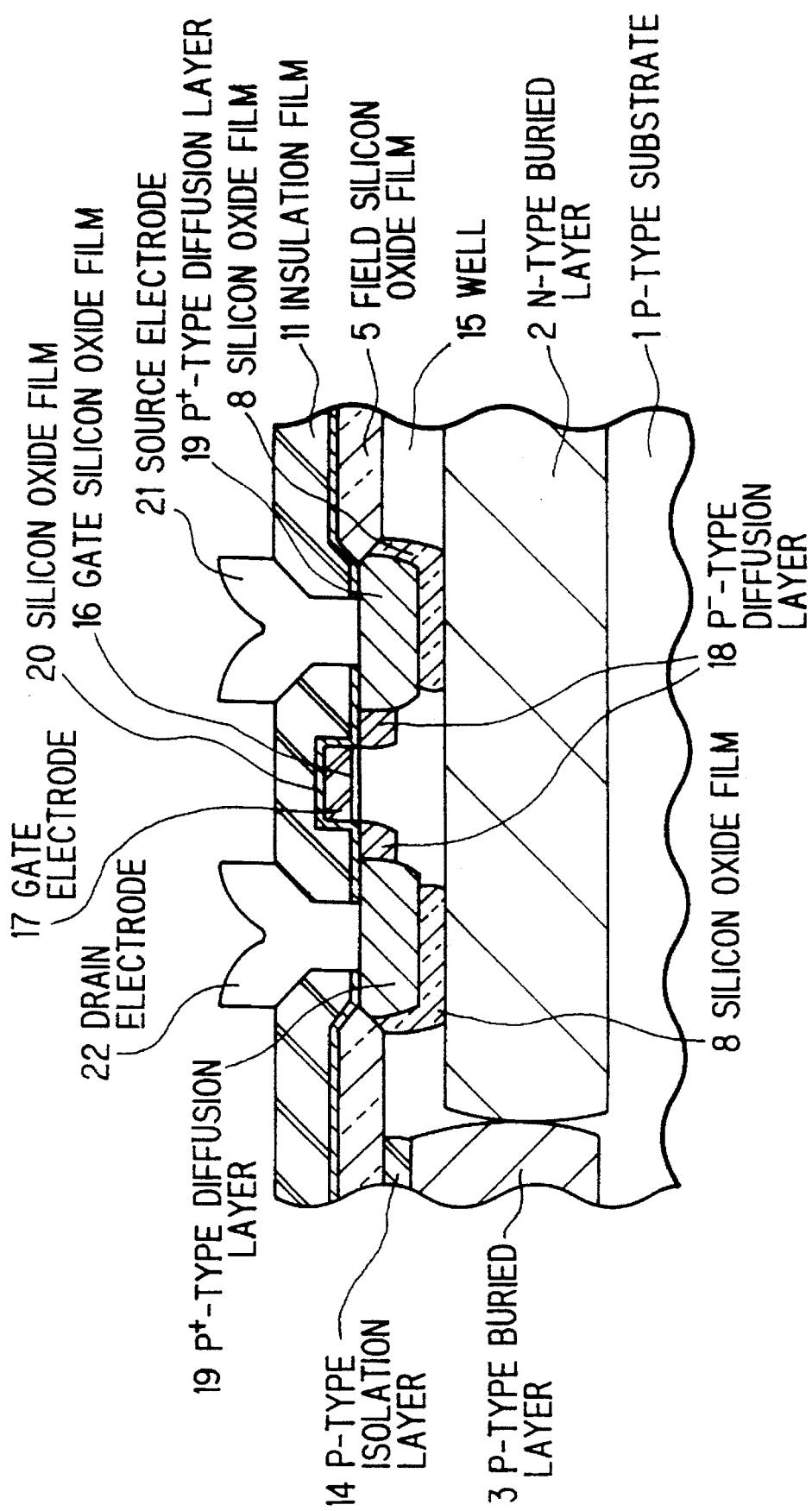
FIG. 10 shows a cross-sectional view of a P-type MOS transistor fabricated by a method according to the invention as a fourth preferred embodiment.

The embodiment shown in the aforementioned drawings shows a case where the invention is applied to a BiCMOS type semiconductor integrated circuit, and a P-type MOS transistor portion is shown in FIG. 10. Since P+-type diffusion layers 19, which respectively serve as a source and a drain regions, are simultaneously formed with the graft bases of the bipolar transistor, silicon oxide films 8s are formed beneath the P+-type diffusion layer 19s. Since junction capacitors between the source and drain regions and the N-type buried layer are decreased by the aforementioned silicon oxide films 8s, and therefore the characteristics of the P-type MOS transistor is remarkably improved.

Hereafter, the method for fabricating the P-type MOS transistor will be explained.

Similarly to the case of the bipolar transistor, a N-type buried layer 2, a P-type buried layer 3, a N-type epitaxial layer 4, a P-type insulation diffusion layer 14 and a field silicon oxide films 5 are successively formed on a P-type substrate 1.

Figure 11A:
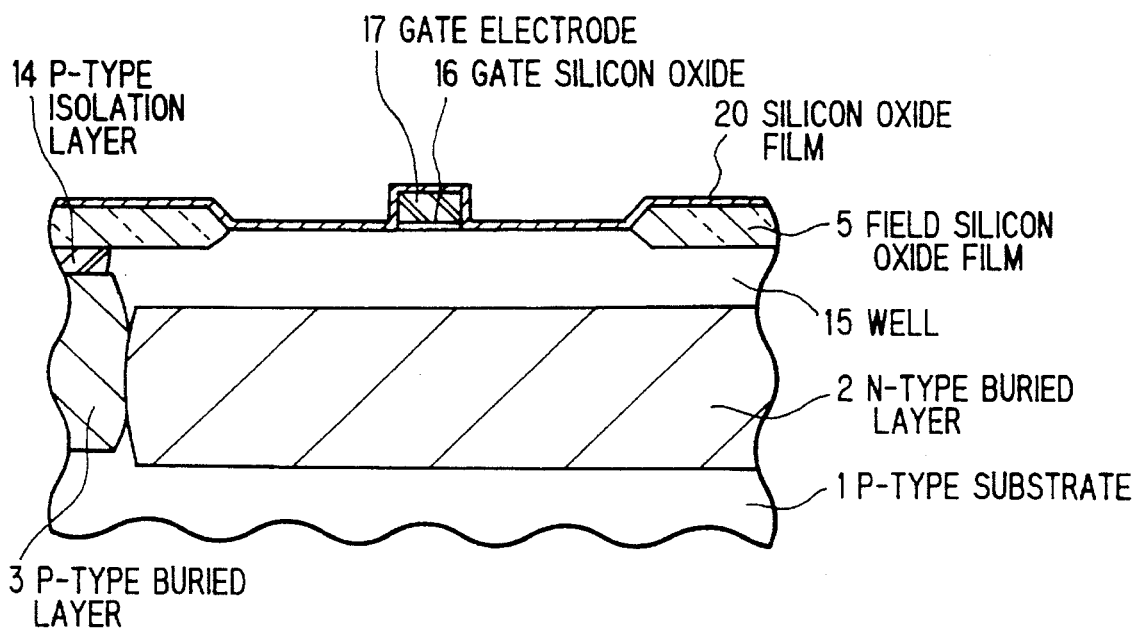

Next, as shown in FIG. 11A, after a well 15 is formed in the N-type epitaxial layer, a gate silicon oxide film 16, a gate electrode 17 and a silicon oxide film 20 for relieving the damage caused by ion implantation.

Figure 11B:
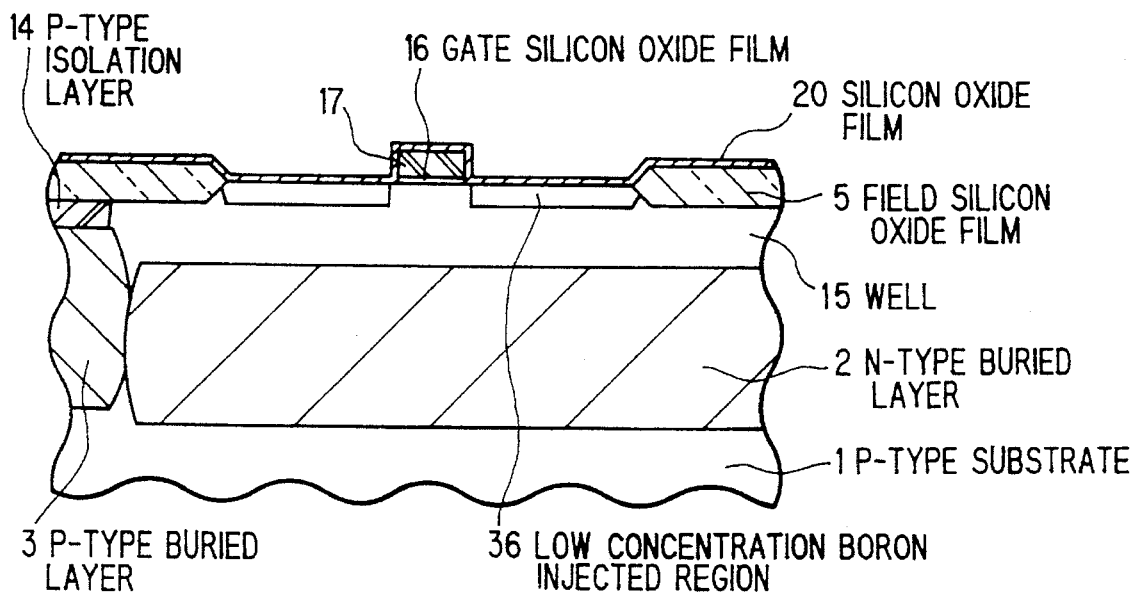

After suitable patterns are formed via a step of photolithography, a P-type impurity, boron for instance, is injected with a dose amount of $3.0 \times 10^{13}$ cm$^{-2}$. Then, low concentration boron injected regions are formed as shown in FIG. 11B.

Next, as shown in FIG. 11C, a mask 32 is simultaneously formed with that of the bipolar transistor. Through the mask 33, boron ions and oxygen ions and successively injected, and a high concentration boron injected region 37 and a oxygen ion injected region 35 are respectively formed.

Then, after removing the mask 33, thermal activating treatment is applied to the processed substrate, and a P$^-$-type diffusion layer 18, a P$^+$-type diffusion layer 19 and a silicon oxide film 8 are formed as shown in FIG. 11D.

Thereafter, returning to FIG. 10, after forming a insulation film 11, contact is opened and a source electrode 21 and a drain electrode 22 are attached.

As mentioned in the above, a bipolar transistor fabricated by the method according to the invention; since an insulation film is formed beneath the graft base, a junction capacitor between the base and the collector can be decreased, the speed of the operation of the bipolar transistor can be increased.

Moreover, the insulation film is simultaneously formed with the formation of the graft base by means of SIMOX, there is no increase of a special step of photolithography for forming the insulation film.

In case of a semiconductor of BiCMOS type, the insulation films are formed beneath the source and drain electrodes of the P-type MOS transistor simultaneously with the bipolar transistor, and there is no increase of a step of photolithography, and the characteristic of the device can be improved.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for fabricating a semiconductor device, comprising the steps of:

providing a semiconductor substrate of a first conductivity type;

forming a buried layer of a second conductivity type, which is of opposite conductivity type to said first conductivity type, on said semiconductor substrate, growing an epitaxial layer of said second conductivity type atop said buried layer of second conductivity type on said semiconductor substrate, forming a silicon oxide film over selected portions of a surface of said epitaxial layer, said silicon dioxide film having at least one opening, forming at least one first region of said first conductivity type over a portion of said at least one opening in said silicon oxide film, forming a mask, which is patterned via photolithography, which exposes a predetermined portion of said first region, introducing impurity ions of said first conductivity type through at least one opening in said mask into said predetermined portion of said first region, introducing oxygen ions through said at least one opening in said mask into said predetermined portion of said first region, and thermally activating said semiconductor substrate to convert said predetermined portion into at least one second region of said first conductivity type which has a higher impurity concentration than that of said first region and which contacts said first region and to concurrently form an insulation film therebeneath.

2. A method for fabricating a semiconductor device according to claim 1, further comprising the step of:

forming a buried layer of said first conductivity type over at least a remaining part of said semiconductor substrate other than the region where said buried layer of said second conductivity type is present.

3. A method for fabricating a semiconductor device according to claim 2, wherein:

said buried layer of said second conductivity type is self-aligned to said buried layer of said first conductivity type.

4. A method for fabricating a semiconductor device according to claim 2, wherein:

said second region of first conductivity type overlies a portion of said buried layer of second conductivity type and overlies a portion of said buried layer of first conductivity type.

5. A method for fabricating a semiconductor device according to claim 1, further comprising the steps of:

forming a region of second conductivity type in a portion of said first region of first conductivity type such that said region of second conductivity type defines an emitter region of a bipolar transistor, said first region of second conductivity type defines a base region of said bipolar transistor and said epitaxial layer of said second conductivity type defines a collector region of said bipolar transistor, and connecting a portion of said epitaxial layer of said second conductivity type to a collector electrode of said bipolar transistor, and connecting said second region of first conductivity type to a base electrode of said bipolar transistor.

6. A method for fabricating a semiconductor device according to claim 1, wherein said at least one second region of first conductivity type comprises at least two second regions of first conductivity type which define a source region and a drain region of an MOS transistor, respectively, and further comprising the steps of:

connecting said source and drain regions of said MOS transistor to a source electrode and a drain electrode, respectively.

7. A method for fabricating a semiconductor device according to claim 3, wherein said at least one first region of first conductivity type comprises a plurality of first regions and said at least one second region of first conductivity type comprises a plurality of second regions, said method further comprising the step of:

forming a plurality of regions of said second conductivity type each in a portion of a respective one of said plurality of first regions, wherein said semiconductor device comprises a semiconductor integrated circuit having a plurality of bipolar transistors in which each of said plurality of bipolar transistors has a portion of said epitaxial layer defining a respective collector region, a respective one of said plurality of regions of second conductivity type defining an emitter region, and a respective one of said plurality of first regions serving as an intrinsic base region, said integrated circuit further having a plurality of MOS transistors in which each of said plurality of MOS transistors has two of said plurality of second regions respectively defining a source region and a drain region.

8. A method for fabricating a semiconductor device according to claim 1, wherein:

said impurity ions and said oxygen ions are introduced through at least one opening in a patterned mask of photoresist.

9. A method for fabricating a semiconductor device according to claim 1, wherein:

said impurity ions and said oxygen ions are introduced through at least one opening in a patterned mask of aluminum.

10. A method for fabricating a semiconductor device according to claim 1, wherein:

said impurity ions and said oxygen ions are introduced through at least one opening in a patterned mask of CVD film.

* * * * *